United States Patent [19]
Ozawa

[11] Patent Number: 5,473,412
[45] Date of Patent: Dec. 5, 1995

[54] ENERGY AMOUNT CONTROLLING METHOD

[75] Inventor: Ken Ozawa, Tokyo, Japan

[73] Assignee: Nikon Corporation, Tokyo, Japan

[21] Appl. No.: 395,187

[22] Filed: Feb. 27, 1995

Related U.S. Application Data

[63] Continuation of Ser. No. 207,099, Mar. 8, 1994, abandoned.

[30] Foreign Application Priority Data

Mar. 8, 1993 [JP] Japan .................................. 5-046373

[51] Int. Cl.[6] .................................................. G03B 27/32
[52] U.S. Cl. .............................. 355/77; 355/53; 355/69; 372/25
[58] Field of Search .............................. 355/53, 69, 68, 355/77; 372/25

[56] References Cited

U.S. PATENT DOCUMENTS

| | | | |
|---|---|---|---|
| 4,711,568 | 12/1987 | Torigoe | 355/68 |
| 4,884,101 | 11/1989 | Tanimoto | 355/68 |
| 4,908,656 | 3/1990 | Suwa et al. | 355/53 |
| 4,952,945 | 8/1990 | Hikima | 346/108 |
| 4,970,546 | 11/1990 | Suzuki et al. | 355/53 |
| 5,053,614 | 10/1991 | Yui et al. | 250/205 |
| 5,097,291 | 3/1992 | Suzuki | 355/69 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |

FOREIGN PATENT DOCUMENTS

| | | |
|---|---|---|
| 2192467 | 11/1988 | United Kingdom . |
| 2155650 | 11/1988 | United Kingdom . |
| 2196132 | 12/1988 | United Kingdom . |
| 2155647 | 12/1988 | United Kingdom . |

*Primary Examiner*—Richard A. Wintercorn
*Attorney, Agent, or Firm*—Shapiro and Shapiro

[57] ABSTRACT

The average number N of coarse exposure pulses is obtained by dividing a proper exposure amount to a wafer by the average pulse energy. Under a condition that the average number N of coarse exposure pulses is equal to or more than the minimum number of pulses $N_{min}$, the achievement accuracy R is calculated by dividing the actual accumulated exposure amount to the wafer by the proper exposure amount and the coarse exposure is performed until the achievement accuracy R reaches the coarse exposure finish judgment level Rc. Thereafter, the attenuating rate for pulse lights is set to be a predetermined value and the correcting exposure is performed by the cutoff control method until the achievement accuracy R reaches the correction exposure finish judgment level Rcc.

11 Claims, 8 Drawing Sheets

ENERGY AMOUNT CONTROLLING METHOD

This is a continuation of application Ser. No. 08/207,099 filed Mar. 8, 1994, now abandoned.

BACKGROUND OF THE INVENTION

1. Field of the Invention

The present invention relates to a method of controlling the amount of energies to be imparted to a substrate and more particularly to a method of controlling the total amount of energies to be imparted to a substrate by emitting a plurality of pulse energies from a pulse oscillation type energy source wherein the energy is changed for each oscillation, e.g., a method of optimally controlling an exposure amount in an exposure apparatus which uses a pulse laser such as an excimer laser as an exposure light.

2. Related Background Art

Exposure apparatuses having a pulse laser light source such as an excimer laser as a light source for exposure have been developed. Generally, the amount of the pulse laser light is varied about ±10% for each pulse and the power thereof decreases in a short period and a long period. Therefore, in such exposure apparatuses as disclosed in, e.g., U.K.P. Nos. GB 2155647 B and GB 2196132 B, the amount of the pulse laser light is detected for each pulse and accumulated. And, pulse emissions are continued until the accumulated value reaches a desired value. Conventional exposure control methods are divided roughly into a correcting exposure type method as disclosed in e.g., U.K.P. Nos. GB 2155650 B and GB 2192467 B and an accumulating exposure type method as disclosed in, e.g., U.S. Pat. Nos. 4,970,546 and 5,097,291 wherein each of the energies of a plurality of pulse lights necessary for exposing a shot area on a substrate is made approximately to coincide with a predetermined average light amount. An example of the correcting exposure method will be described below.

As shown in FIG. 8A, when exposing the projected image of the pattern of a reticle by a plurality of pulse lights on a photosensitive substrate (semiconductor wafer coated with photoresist, glass plate, etc.), the exposure is performed in two stages in the correcting exposure method. In the first stage, coarse exposure is performed in which pulse lights RE with large energies are used to impart an exposure amount slightly smaller than a proper exposure amount to the photosensitive substrate. In the second stage, correcting exposure is performed in which pulse lights CE with small energies are used to impart a remaining exposure amount to the photosensitive substrate. That is, in the correcting exposure method, as shown in FIG. 8B, an integrated or accumulated exposure amount (exposure energy) smaller by $\Delta E$ than the proper exposure amount EG is imparted to the photosensitive substrate by illumination of the plurality of pulse lights RE (coarse exposure). At this time, the remaining exposure energy $\Delta E$ is set to be smaller than, e.g., the exposure energy of each of the pulse lights RE for the coarse exposure. Next, in the correcting exposure, an attenuator or a light reducing filter is used to attenuate the exposure energy of the laser light per a pulse and the attenuated laser light (pulse light CE) is illuminated on the photosensitive substrate for a few of pulses so as to correspond to the remaining exposure energy $\Delta E$. Thus, by the coarse and correcting exposures, the proper exposure amount EG is imparted to the photosensitive substrate. In this correcting exposure method, as the coarse exposure is carried out until the slightly lower level (EG–$\Delta E$) than the proper exposure amount EG, the total number of pulse lights for an exposure can be limited small, preventing the throughput from being lowered. Further, in the correcting exposure, the pulse lights CE with small energies are used for exposure, so that the finally accumulated exposure amount can be made to coincide with the proper exposure amount EG or can be set within a predetermined allowable error range.

Also, for the correcting exposure, e.g., a light reducing filter plate 1 as shown in FIG. 9A is used to attenuate the power of laser lights. The light reducing filter plate 1 is provided with six mesh filters 2A to 2F arranged on the peripheral portion thereof at 60° intervals. The mesh filters 2A to 2F have different attenuating rates (transmittances) as shown in FIG. 9B. For example, the transmittance of the mesh filter 2A is 100% and that of the mesh filter 2B is about 50%. It is possible to set the power of a laser pulse light LB to a desired level by rotating the light reducing plate 1 around an axis 1a to dispose the desired mesh filter in the optical light path.

However, in the above correcting exposure method, in order to obtain a desired exposure control accuracy, one of the mesh filters 2A to 2F of the light reducing filter plate 1 is selected in accordance with the deficient exposure amount ($\Delta E$) at the time of the finish of the coarse exposure. Then, the light reducing filter plate 1 is driven to position the selected filter in the optical light path of the laser light. Therefore, it takes a long time for switching the transmittance of the light reducing filter plate 1, resulting in lowering of the throughput. Further, although the combination of the energy regulating amount by the correcting exposure and the number of correcting exposure pulses is determined at the time of the finish of the coarse exposure, the combination is determined based on a control map stored in a memory of the exposure apparatus. This control map is determined in accordance with the respective transmittances of the plurality of mesh filters of the light reducing filter plate 1. Therefore, there is inconvenience in that the control map needs to be formed for each exposure apparatus.

SUMMARY OF THE INVENTION

It is an object of the present invention to provide an exposure control method capable of shortening the time necessary for energy regulation prior to the correcting exposure.

It is another object of the present invention to provide an exposure control method in which there is no need to form a complicated control map.

The present invention is applied to an exposure apparatus which transfers a pattern formed on a first substrate to a photosensitive second substrate by illuminating the first substrate with a plurality of pulse lights whose amounts are varied for respective oscillations and controls an accumulated exposure amount to be imparted to the second substrate so as to be a predetermined proper exposure amount. Therefore, the present invention comprises a first step of setting the attenuating rate of pulse lights emitted from the pulse light to a first attenuating rate such that the first average number of exposure pulses obtained by dividing the proper exposure amount by the average pulse energy of the pulse lights becomes equal to or more than the first minimum number of exposure pulses necessary for setting the accumulated exposure amount to the second substrate within a predetermined target control accuracy to the proper exposure amount as well as averaging the interference pattern on the second substrate sufficiently and the second step of determining a first exposure amount based on the first average number of exposure pulses, the target control accuracy and the scatter of energies of the pulse lights.

Further, the present invention comprises the third step of oscillating pulse lights under the first attenuating rate until the accumulated exposure amount to the second substrate becomes equal to or more than the first exposure amount; the fourth step of setting, when the accumulated exposure amount to the second substrate is less than the values within the target control accuracy with respect to the proper exposure amount, the attenuating rate of pulse lights emitted from the pulse source to be a second attenuating rate between the target control accuracy, the scatter of the energies of the pulse lights and the minimum attenuating rate determined in accordance with a second set exposure amount between the first set exposure amount and the proper exposure amount and the maximum attenuating rate determined by the limit of the time necessary for the exposure; the fifth step of setting the actual value of the second set exposure amount in accordance with the number of exposure pulses in the third step and the second attenuating rate; and the sixth step of oscillating pulse lights until the accumulated exposure amount with respect to the second substrate becomes equal to or more than the second exposure amount.

Also, if the average pulse energy of the pulse lights is Pave, the first average number of exposure pulses is N and the second attenuating rate is a, the second set exposure amount E2 is preferably set to be $$E2=N \cdot Pave - (a/2) \, Pave.$$

Further, the present invention comprises a simple accumulating type exposure mode for emitting pulse lights under a constant attenuating rate until the accumulated exposure amount to the second substrate becomes equal to or more than the lower limit of the range of the target control accuracy with respect to the proper exposure amount such that the first average number of exposure pulses obtained by dividing the proper exposure amount by the average energy of the pulse lights becomes equal to or more than the minimum number of exposure pulses necessary for setting the accumulated exposure amount to the second substrate to be the proper exposure amount within the target control accuracy under the constant attenuating rate of the pulse lights. Then, it is preferable to select either the simple accumulating type exposure mode or the two stage switching type exposure mode of the above-mentioned first to sixth steps so as to make the time for performing one time exposure to the second substrate shortest.

According to the present invention as above, in the third step, the first exposure (coarse exposure) is performed under the first attenuating rate until the accumulated exposure amount to the second substrate becomes equal to or more than the first exposure amount. Further, in the sixth step, the second exposure (correcting exposure) is performed under the second attenuating rate until the accumulated exposure amount to the second substrate becomes equal to or more than the second exposure amount. That is, the correcting exposure (sixth step) as well as the coarse exposure (the third step) are performed by the so-called cutoff control. As a result, its control is easy and the mechanism of the light-reducing portion for correcting exposure can be simplified as compared with the conventional correcting exposure method wherein the combination of the number of pulses for the correcting exposure and the attenuating rate is obtained by calculation at the time of the end of the coarse exposure. Also, it is possible to reduce the time necessary for the energy regulation prior to the correcting exposure, contributing to the improvement of the throughput of the exposure apparatus. Further, the parameter required at the time of the correcting exposure is only the energy regulating amount (the second attenuating rate), which then is stored in the memory of the apparatus. At this time, the exposure finish judgment level (second exposure amount) for the correcting exposure is determined in accordance with the first average number of exposure pulses, so it should be calculated before the correcting exposure. Accordingly, there is no need to form the complicated control map for each exposure apparatus.

Also, when the average energy amount of the pulse lights, the first average number of exposure pulses and the second attenuating rate are respectively Pave, N and a and when the second set exposure amount E2 is set to be $E2=N \cdot Pave-(a/2)$, the proper exposure amount is $N \cdot Pave$ and the average exposure energy per a pulse is $a \cdot Pave$. Therefore, the intermediate value between the accumulated exposure amount to the second substrate at the time when the exposure is stopped at the second set exposure amount E2 and the accumulated exposure amount at the time when further a final pulse is oscillated from the second set exposure amount E2 becomes the proper exposure amount $N \cdot Pave$. As a result, the average value of the accumulated exposure amounts to the respective shot areas on the second substrate at the time when a final pulse is oscillated or is not oscillated becomes the proper exposure amount. Then, it is advantageous in that the average value of the accumulated exposure amounts will not be deviated from the proper exposure amount.

Further, the present invention comprises the simple accumulating type exposure mode which makes the attenuating rate of pulse lights constant and oscillates pulse lights until the accumulated exposure amount to the second substrate becomes equal to or more than the lower limit of the range of the target control accuracy with respect to the proper exposure amount. And, either the two stage switching type exposure mode or the simple accumulating type exposure mode is selected to perform exposure for the second substrate so as to make the time of the exposure for the second substrate shortest, enabling improvement of the throughput considerably.

DETAILED DESCRIPTION OF THE PREFERRED EMBODIMENTS

An exposure control apparatus of an embodiment according to the present invention will be described with reference to FIGS. 1 to 7. In this embodiment, the exposure control apparatus is a reduction projection type exposure apparatus (stepper), wherein a pattern of a reticle is transferred to a wafer by a pulse laser source in a step and repeat manner.

Figure 1:
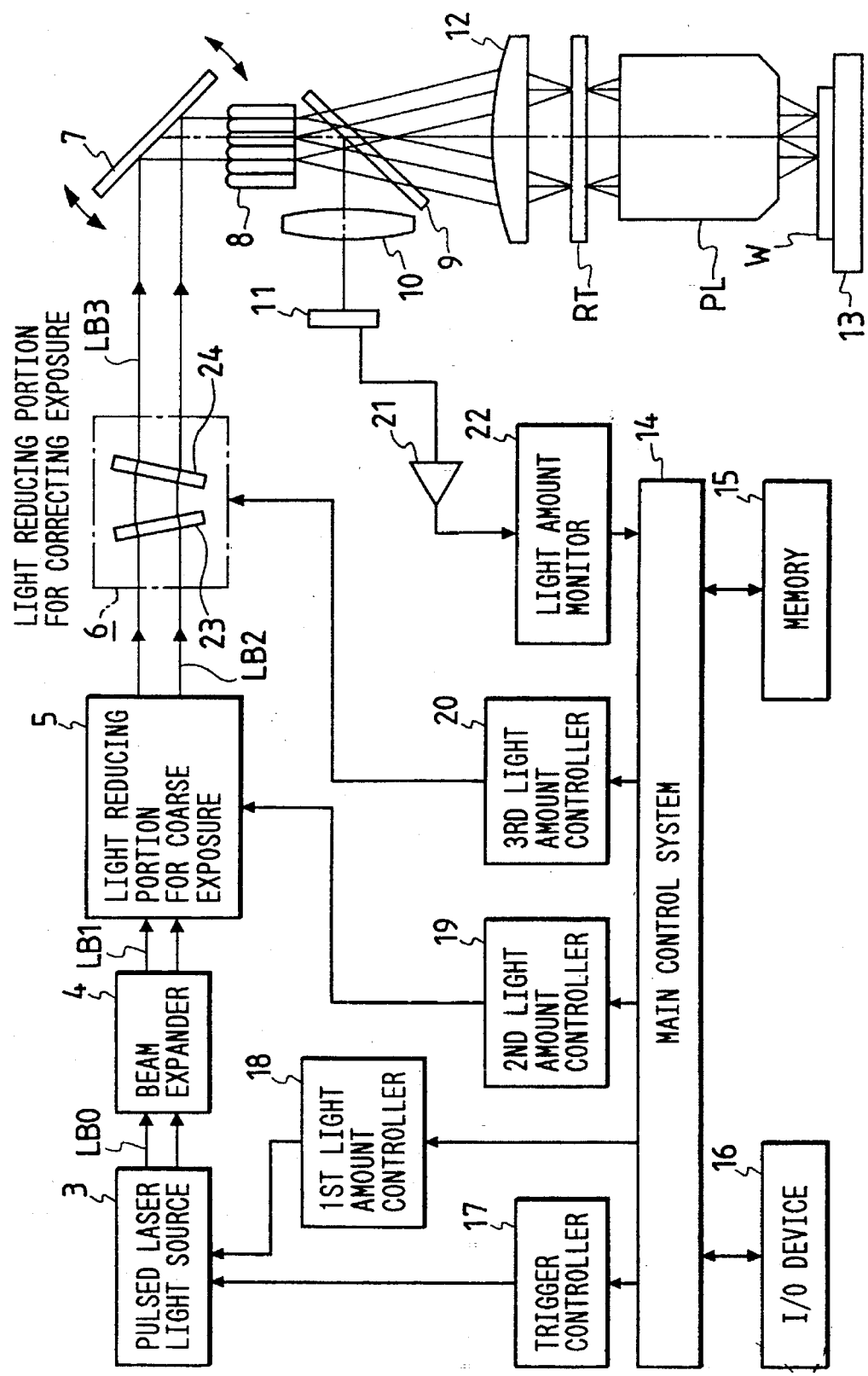
FIG. 1 schematically shows a projection exposure apparatus according to an embodiment of the present invention.

In FIG. 1 showing the stepper, a pulse laser light source 3 such as an excimer laser has a narrowband wavelength stabilizing mechanism with an etalon, a dispersing device (e.g., grating) or the like between two resonant mirrors interposing a laser tube and is structured as the laser light source having a resonation as disclosed in U.S. Pat. No. 4,952,945. The pulse laser light source 3 emits a pulse laser light within a ultraviolet region for exposing a photoresist on the wafer, e.g., a KrF excimer laser light having the wavelength of 248 nm within a for ultraviolet region, by generating electric discharge of high voltage between two electrodes provided parallel to each other along the optical axis of the laser light.

The shape of the cross section of the laser beam LB0 emitted from the pulse laser light source 3 is rectangular and its ratio of length to breadth is 1:2 to 1:5. The laser beam LB0 enters a beam expander 4 formed of, e.g., two concave and convex cylindrical lenses, whereby the width of the laser beam LB0 in the short side direction of its cross section is expanded. As a result, the laser beam LB1 emanated from the beam expander 4 has an approximately square shape in the cross section.

Figure 9A:
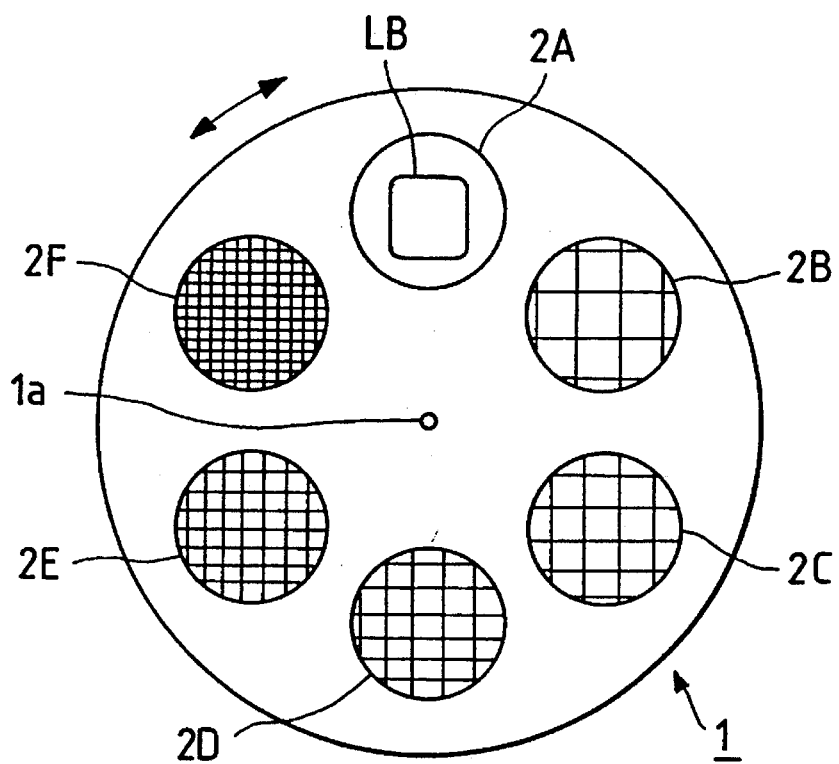
FIG. 9A is a diagram of the conventional light reducing portion for correcting exposure and the light reducing portion for coarse exposure of FIG. 1.
Figure 9B:
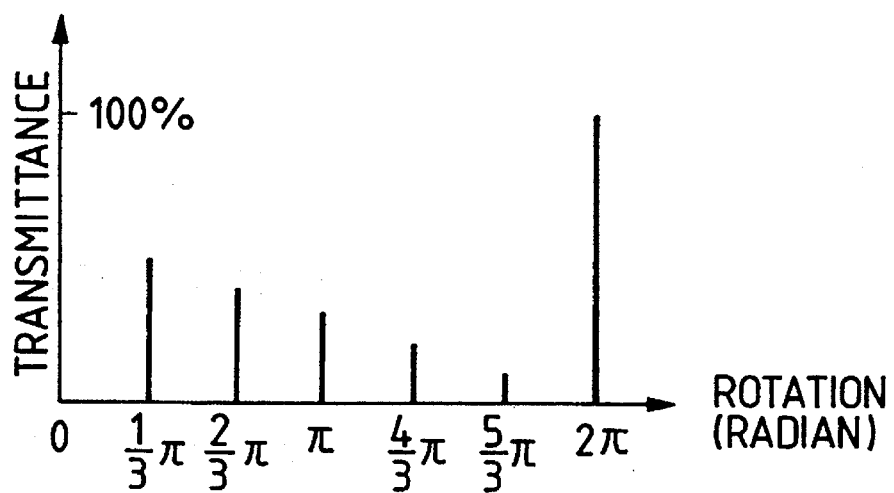
FIG. 9B shows the transmittances of the respective light reducing filters of FIG. 9A.

Then, the laser beam LB1 is incident on a light reducing portion 5 for coarse exposure which reduces the light amount (energy) of the laser beam LB1 continuously or in stages. In this embodiment, a light reducing filter plate 1 of FIG. 9A is used as the light reducing portion 5 for coarse exposure in which the light amount of the laser beam LB1 can be reduced in stages by six mesh filters 2A to 2F. When exposing the projected image of the pattern of a reticle RT successively on each of a plurality of shot areas on a wafer W, the transmittance (attenuating rate) of the light reducing portion 5 for coarse exposure is not changed during the exposure process of the single wafer W. That is, the transmittance is the same for each shot area. Therefore, even though the light reducing filter plate 1 which takes a time to position the respective filters 2A to 2F is used as the light reducing portion 5 for coarse exposure, the throughput of the exposure apparatus will not be lowered if the light reducing filter plate 1 is driven while a wafer stage 13 is being shifted or the wafer is being replaced.

Figure 2A:
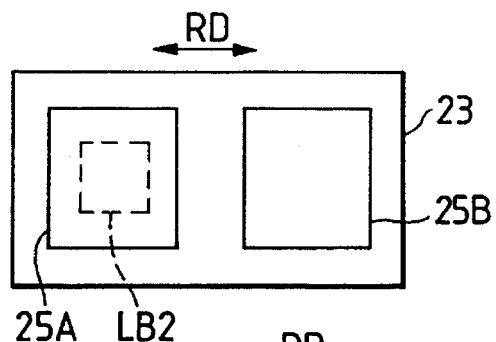
FIG. 2A shows the light reducing portion for correcting exposure in FIG. 1.

The laser beam LB2 emitted from the light reducing portion 5 for coarse exposure enters a light reducing portion 6 for correcting exposure which has a light reducing filter plates 23 and 24. The light reducing filter plates 23 and 24 are disposed on the optical axis of the laser beam LB2 slidably like a V-shape (symmetrically with respect to a plane). The light reducing filter plate 23 has light reducing filters 25A and 25B which are arranged next to each other in the RD direction, as shown in FIG. 2A. The transmittance of the light reducing filter 25A with respect to the laser beam LB2 is 100% while that of the light reducing filter 25B is $a_1 \times 100\%$ ($0 < a_1 < 1$, $a_1$ is a real number, e.g., $a_1 = 0.25$). The light reducing filter 25B is, e.g., a mesh filter or a dielectric with a predetermined transmittance. As is not shown, the light reducing filter plate 24 has the same construction as the light reducing filter plate 23. That is, the light reducing filter plate 24 has two light reducing filters which are arranged adjacently in the RD direction and have the transmittance of 100% and the transmittance of $a_2 \times 100\%$ ($0 < a_2 < 1$, $a_2$ is a real number, e.g., $a_2 = 0.3$) respectively. Also, the light reducing filter plates 23 and 24 are slidable independently in the RD direction. It is to be noted that the direction RD of FIG. 2 is a perpendicular direction to the paper of FIG. 1. Accordingly, it is possible to dispose the desirable light reducing filter with the predetermined transmittance in the optical light path in order to change the transmittance with respect to the laser beam LB2 by stages by shifting the respective light reducing filter plates 23 and 24 independently. In this embodiment, when the constants $a_1$ and $a_2$ are $a_1 = a_2$, the transmittance of the light reducing portion 6 for correcting exposure can be changed in four stages. Also, when $a_1 = a_2$, the transmittance can be changed in three stages. For example, the light reducing filters 23 and 24 are formed by providing a glass base such as quartz with a light-shielding layer (chrome layer) or a dielectric. That is, the light reducing filter with the 100% transmittance is formed by partially removing the light-shielding layer attached to the glass base by etching. Also, the light reducing filter with the transmittance of $a_1 \times 100\%$ or $a_2 \times 100\%$ is formed by attaching a dielectric with a predetermined thickness to a glass base. The structure of the light reducing plates 23 and 24 is not limited to the above and, e.g., on two light reducing filters may be provided in a slider.

The light reducing portion 6 for correcting exposure attenuates the laser beam LB2, i.e., emits a laser beam LB3 with an exposure energy which is obtained by multiplying the energy of the laser beam LB2 by the transmittance thereof. In this embodiment, the refractive index and the thickness of the light reducing filter plate 23 are the same as those of the light reducing filter plate 24 and the light reducing filter plates 23 and 24 are disposed in the shape of V. Therefore, the optical axis of the laser beam LB3 coincides with that of the laser beam LB2. Also, as the light reducing filter plates 23 and 24 are slidable and selectable transmittances in each thereof are two kinds, the size of each of the light reducing filters can be made sufficiently large with respect to the laser beam LB2. As a result, the positioning accuracy of the light reducing filter plates 23 and 24 may be rough, thereby making it possible to switching the transmittance of the light reducing portion 6 for correcting exposure at high speed.

Figure 2B:
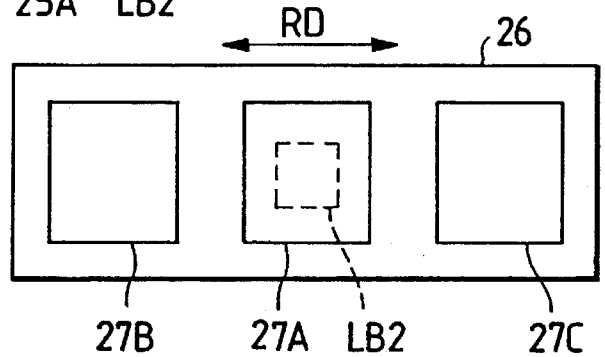
FIGS. 2B, 3A and 3B shows another examples of the right reducing portion for correcting exposure.

As the light reducing filter plates for the light reducing portion 6, a slidable light reducing plate 26 as shown in FIG. 2B may be utilized. The light reducing plate 26 has three light reducing filters 27A to 27C which are disposed so as to be adjacent to each other in the RD direction. The light reducing filter 27A has the 100% transmittance and the light reducing filters 27B and 27C arranged on the lateral sides of the filter 27A have different transmittances. In this case, the center light reducing filter 27A with the 100% transmittance is used during the coarse exposure. On the other hand, during the correcting exposure, even though the slide amount is the largest, one of the light reducing filters 27B and 27C is selectively used. Therefore, the slide amount of the light reducing filter plate 26 is small. Further, the size of each of the filters 27A to 27C can be made larger than the cross section of the laser beam LB2, so that the positioning accuracy of the filters 27A to 27C may be rough. Accordingly, the transmittance of the light reducing portion 6 for correcting exposure can be switched considerably at high speed.

Figure 3A:
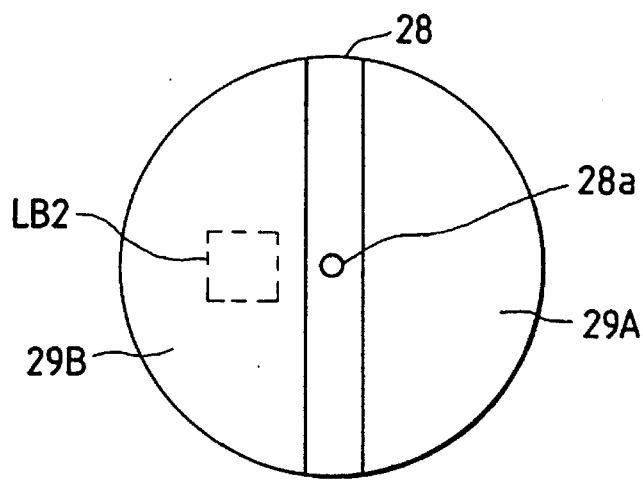

Further, as the light reducing filter plates, a rotatable light reducing filter plate 28 as shown in FIG. 3A may be used. The filter plate 28 is provided on its lateral semicircular portions with respective filter sections 29A and 29B having different transmittances. For example, the transmittance of the filter section 29A is 100% while that of the filter section 29B is $a_3 \times 100\%$ ($0 < a_3 < 1$, $a_3$ is a real number, e.g., $a_3 = 0.25$). During the coarse exposure, the filter section 29A with the 100% transmittance is used. On the other hand, during the correcting exposure, the filter section 29B is used by rotating the light reducing filter plate 28 around an axis 28a at the angle of 180°. Also, each of the filter sections 29A and 29B can be formed larger than the cross section of the laser beam LB2. Thereby, the positioning accuracy of the filter sections 29A and 29B may be rough, making it possible to switch the transmittance of the light reducing portion 6 for correcting exposure at high speed.

Figure 3B:
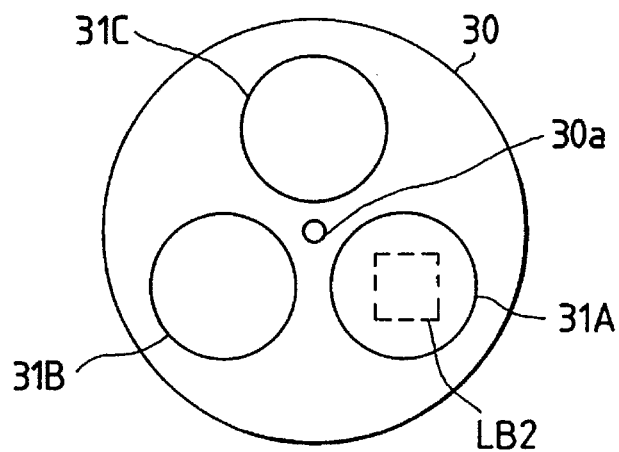

Further, as the light reducing filter plates, a rotatable light reducing filter plate 30 with three filters 31A to 31C as shown in FIG. 3B may be used. The three filters 31A to 31C have respectively different transmittances and are disposed equally at the same angle intervals. For example, the respective transmittances of the filters 31A to 31C are 100%, $a_1 \times 100\%$ and $a_2 \times 100\%$. Then, during the coarse exposure, the filter 31A with the 100% transmittance is used. On the other hand, during the correcting exposure, even when the rotation angle is the largest, one of the filters 31B and 31C is selected by rotating the light reducing filter plate 30 around an axis 30a only at 120°. Also, each of the filters 31A to 31C can be formed larger than the cross section of the laser beam LB2. Therefore, the positioning accuracy of the light reducing filter 30 may be rough and it is possible to switch the transmittance of the light reducing portion 6 for correcting exposure at high speed.

Back to FIG. 1, the laser beam LB3 emanated from the light reducing portion 6 for correcting exposure is reflected by an oscillating mirror 7 and enters an optical integrator (fry eye lens) 8 to form a number of secondary light sources on the focal surface of the fry eye lens 8 on the rear side (reticle side). The laser lights from the secondary light sources are transmitted through a beam splitter 9 disposed so as to be inclined at 45° with respect to the optical axis and illuminate the reticle RT via a condenser lens 12. Thereby, the circuit pattern of the reticle RT is transferred via a projection optical system PL to the photoresist layer of the wafer W supported by the wafer stage 13. At this time, the oscillating mirror 7 is oscillated in synchronism with pulse oscillations of the light source 3 to shift an interference pattern (speckle pattern) with natural periods which is formed on the reticle RT or the wafer W because of the coherency of the laser beam LB3. As a result, the influence of the interference pattern of the laser beam (the decrease of the uniformity of illuminance) is reduced. Its detailed operation principle is disclosed in U.S. Pat. No. 4,970,546 and then omitted here.

A portion of the laser lights divided by the beam splitter 9 is condensed on a light receiving surface of a light receiving device 11 disposed in a conjugate plane with respect to the pattern formed surface of the reticle RT. The light receiving device 11 outputs an photoelectric converting signal for each pulse in accordance with its light amount (intensity) and is constituted of a PIN diode or the like which has a sufficient sensitivity in the ultraviolet region and a sufficiently high response speed. The photoelectric converting signal is supplied to a light amount monitor 22 via an amplifier 21. The light amount monitor 22 accumulates the photoelectric converting signals from the light receiving device 11 sequentially during the exposure of one shot. The obtained accumulation signal is sent to a main control system 14. Also, the conversion ratio of the photoelectric converting signal from the light receiving device 11 to the exposure energy amount to the wafer W is obtained preliminarily by the actual measurement and the convertion ratio is stored in a memory 15, so that the main control system 14 can monitor the actual accumulated or integrated exposure amount on the wafer W during exposure. Thereby, the accumulated exposure amount on the wafer W can be controlled so as to be a proper exposure amount.

The main control system 14 controls the whole operation of the apparatus. The memory 15 and an input/output device 16 are connected to the main control system 14. The memory 15 stores parameters (constants) necessary for the exposure operation and various calculations and control formulas. The input/output device 16 receives commands from an operator and outputs necessary information for the operator. Also, the main control system 14 controls oscillations (the number of light emitting pulses, the intervals of oscillations or the like) of the pulse laser light source 3 via a trigger controller 17. The main control system 14 also controls the pulse energy emanated from the pulse laser light source 3 via a first light amount controller 18. The first light amount controller 18 regulates the energy of the pulse laser light by controlling the high discharge potential.

A second light amount controller 19 changes the transmittance of the light reducing portion 5 for coarse exposure by controlling the rotation light reducing filter plate 1 constituting the light reducing portion 5. Further, a third light amount controller 20 changes the transmittance of the light reducing portion 6 for correcting exposure by shifting the light reducing filter plates 23 and 24 constituting the light reducing portion 6. The main control system 14 sets the respective transmittances of the light reducing portions 5 and 6 via the first and second light amount controllers 19 and 20 so as to be values obtained by procedure to be described later. further, the main control system 14 outputs a drive signal to a drive section (not shown) of the oscillating mirror 7 such that the pulse light emission of the pulse laser light source 3 is synchronized with the angle of deflection of the oscillating mirror 7.

Figure 8A:
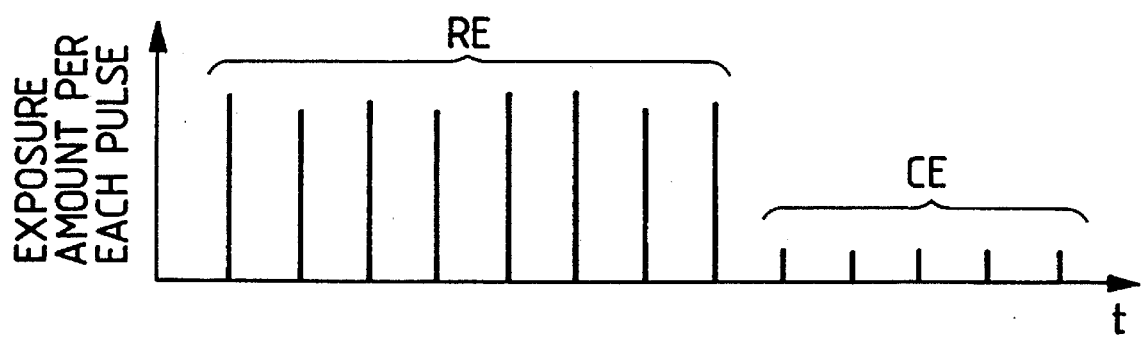
FIGS. 8A and 8B are diagrams,for explaining the basic concept of the correcting exposure method.
Figure 8B:
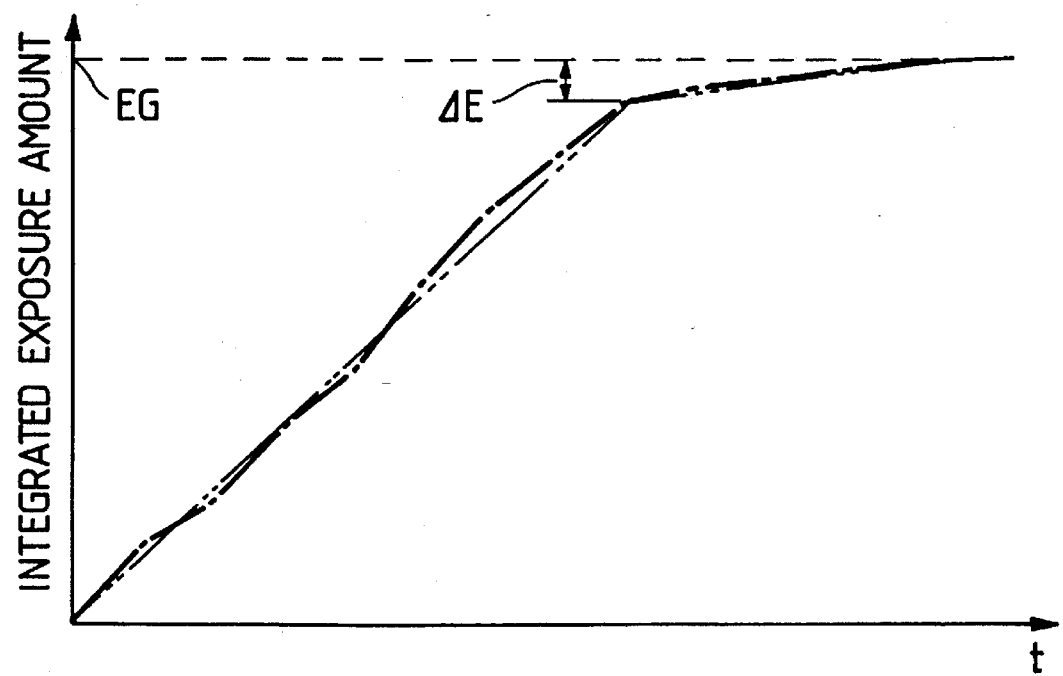

Next, a method of controlling the accumulated exposure amount to be imparted to the wafer W with respect to the proper exposure amount within a target control accuracy at the time of exposing the projected image of the pattern of the reticle RT on a shot area on the wafer W will be described hereinafter. In this embodiment, in order to make the value of the accumulated exposure amount detected by the light amount monitor 22 of FIG. 1 coincide with a target control value, i.e., the proper exposure amount ($S_0$) at the time of exposing each shot area on the wafer W, a coarse exposure period wherein a plurality of pulse lights each having a large energy amount (light amount) are used and a correcting exposure period wherein at least one pulse light having a small energy amount are set in a similar manner to the conventional method, as shown in FIG. 8A. Then, the average value of the light amounts (pulse energies) on the wafer W for respective pulses (e.g., the average value of the light amounts of 100 pulses) and its scatter are assumed to be Pave and δS respectively. Also, the proper exposure amount $S_0$ per a shot on the wafer W is initially given by the operator in accordance with the photosensitive characteristics of the photoresist or the like. The value N obtained by dividing the proper exposure amount $S_0$ by the average value of pulse energies: Pave represents the average number of coarse exposure pulses. That is, the following equation holds.

$$S_0 = N \cdot \text{Pave}. \tag{1}$$

Also, the number of correcting exposure pulses and the target control accuracy of the accumulated exposure amount per a shot on the wafer W are assumed respectively to be n and A (e.g., when the target control accuracy is 0.01%, A=0.01). As disclosed in U.S. Pat. No. 4,970,546, the average number N of coarse exposure pulses necessary for limiting the final accumulated exposure amount on the wafer W within the target control accuracy A needs to be equal to or more than the following integer Na:

$$N \geq \text{int}\left( \frac{1}{A} \cdot \frac{\delta P}{\text{Pave}} \cdot \frac{1+\delta P/\text{Pave}}{\sqrt{n} + \delta P/\text{Pave}} + 1 \right) = Na \tag{2}$$

When the pulse laser light source 3 is an excimer laser source, $\delta P/\text{Pave}$ is about 0.10. Also, if the number n of correcting exposure pulses and the target control accuracy are 1 and 1% (A=0.01) respectively, the integer Na is 11 or more by the equation (2). In the meantime, the number of pulses necessary for sufficiently averaging the speckle pattern on the wafer W by the oscillating mirror 7 in FIG. 1 is determined in accordance with the various characteristics of the photoresist on the wafer W. It can be obtained preliminarily by tests or the like. Here, the number of pulses necessary for fully averaging the speckle pattern is assumed to be Nb. Then, the minimum number of exposure pulses necessary for limiting the exposure amount within the target control accuracy as well as averaging the speckle pattern fully becomes as follows. Here, max (x, y) represents the larger number between x and y.

$$\text{Nmin} = \max (Na, Nb) \tag{3}$$

Now, for judging the finish of the coarse exposure, a coarse exposure finish judgment level Rc is introduced. The coarse exposure finish judgment level Rc means that when the accumulated exposure amount actually measured during the coarse exposure reaches N·Pave·Rc, the coarse exposure is finished. Also, as disclosed in U.S. Pat. No. 4,970,546, the judgment level Rc is defined that when the coarse exposure is performed for one more pulse from the judgment level Rc, the accumulated exposure amount reaches N·Pave·(1+A) which is the upper limit of the allowable range. Also, in consideration of the scatter of pulse energies, the maximum value of the exposure amount per a pulse is (Pave+δP). That is, the following relationship holds:

$$N \cdot \text{Pave} \cdot Rc + (\text{Pave} + \delta P) = N \cdot \text{Pave} \ (1+A) \tag{4}$$

from the equation (4), the coarse exposure finish judgment level Rc becomes:

$$Rc = 1 + A - \frac{1 + \delta P/\text{Pave}}{N} \tag{5}$$

Figure 4:
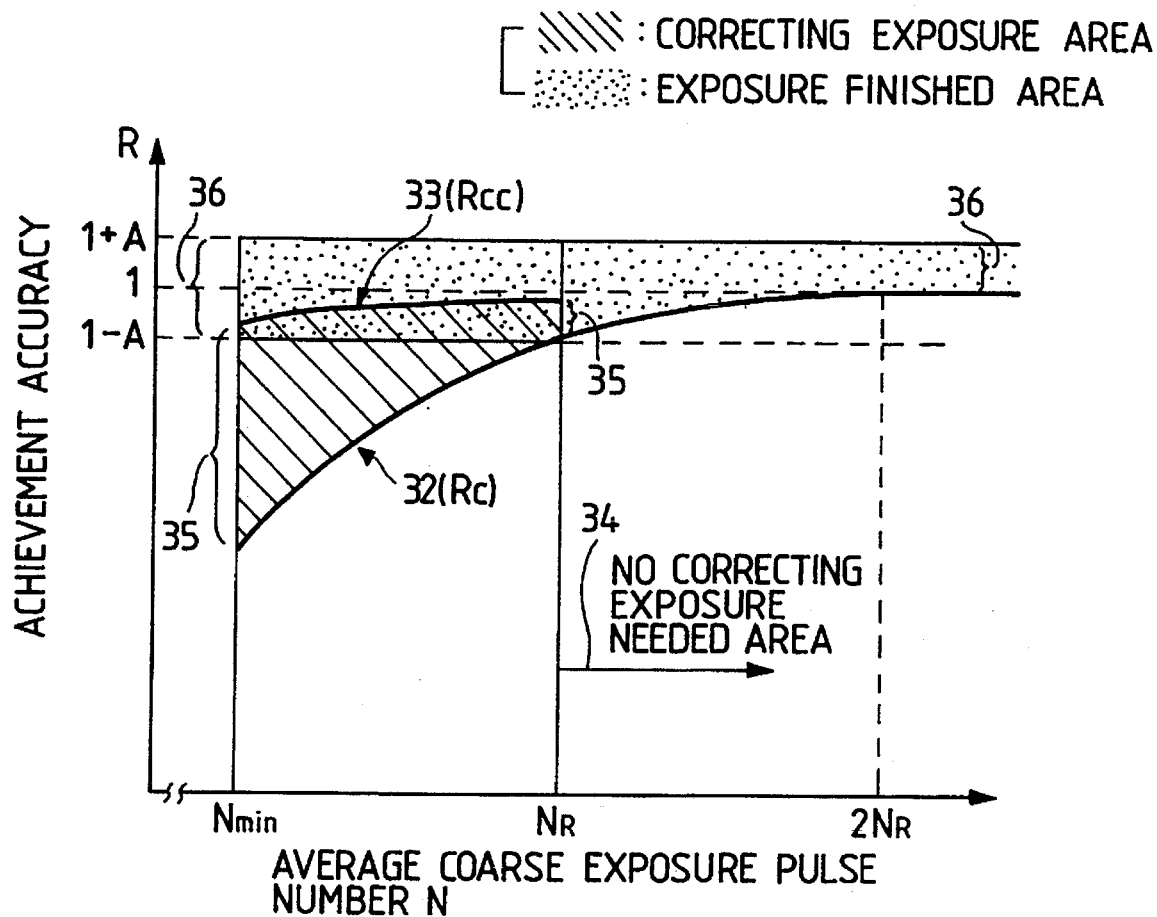
FIG. 4 is an explanatory diagram showing the difference between the correcting exposure mode and the accumulating exposure mode.

FIG. 4 shows a relationship of the coarse exposure finish judgment level Rc to the average number N of coarse exposure pulses by a curve 32. The value obtained by dividing the actual accumulated exposure amount by the proper exposure amount: N·Pave is called the achievement accuracy R. In the coarse exposure, the exposure is performed until the accumulated exposure amount exceeds N·Pave·Rc. In this case, in the area where the following expression holds, i.e., a correcting exposure unnecessary area 34, the accumulated exposure amount enters within the target control accuracy with respect to the proper exposure amount only by the coarse exposure. As the result, the correcting exposure is unnecessary.

$$Rc \geq 1 - A \tag{6}$$

By substituting the equation (5) for the expression (6), the condition of the average number N of coarse exposure pulses at the time when the correcting exposure is unnecessary is expresses as:

$$N \geq \frac{1 + \delta P/\text{Pave}}{2A} \quad N_R = \text{int}\left( \frac{1 + \delta P/\text{Pave}}{2A} \right) \tag{7}$$

Here, if e.g., the scatter of the pulse energies: δP/Pave is 0.10 and the exposure control accuracy A is 0.01, the integer $N_R$ of the equation (7) becomes 55 or more. That is, when $N \geq N_R$, the correcting exposure is not carried out.

Next, the finish judgment of the correcting exposure is described. When the achievement accuracy R obtained by dividing the actual exposure amount at the time of the finish of the coarse exposure by N·Pave satisfies $Rc \leq R \leq (1-A)$, the correcting exposure is performed, which is an area 35 in FIG. 4. If the transmittance set in the light reducing portion 6 for correcting exposure in FIG. 1 at the time of the correcting exposure is a, a correcting exposure finish judgment level Rcc is determined such that the accumulated exposure amounts in two cases where a final pulse is emitted or is not emitted from the correcting exposure finish judgement level become symmetrical with respect to the proper exposure amount. In this case, the correcting exposure is performed until the accumulated exposure amount reaches N·Pave·Rcc.

Figure 5:
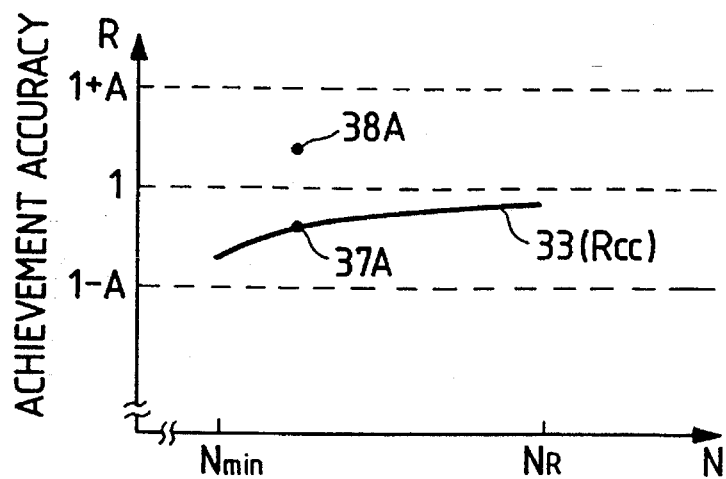
FIG. 5 an explanatory diagram showing the way of determining the correcting exposure finish judgment level Rcc.

FIG. 5 shows the correcting exposure finish judgment level Rcc by a curve 33 as the function of the average number N of coarse exposure pulses. In FIG. 5, two cases are supposed that the final pulse is located at a position 37A on the curve 33 or is located at a position 38A exceeding the position 37A on the curve 33. Then, the correcting exposure finish judgment level Rcc is determined such that the intermediate point between the positions 37A and 38B becomes the proper exposure amount (i.e., the achievement accuracy is 1). Thereby, the following equation holds:

$$N \cdot \text{Pave} \cdot Rcc + \frac{a \cdot \text{Pave}}{2} = N \cdot \text{Pave} \tag{8}$$

From the equation (8), the correcting exposure finish judgment level Rcc is expressed by the function of the transmittance a and the average number N of coarse exposure pulses as:

$$Rcc = 1 - \frac{a}{2N} \tag{9}$$

As shown in FIG. 4, the area 35 sandwiched by the curve 32 representing the coarse exposure finish judgment level Rc under $\text{Nmin} \leq N < N_R$ and the curve 33 representing the correcting exposure finish judgment level Rcc is the area (correcting exposure area) wherein the correcting exposure is performed. Also, an area 36 sandwiched by the curve 33 and the line representing R=(1+A) under $\text{Nmin} \leq N < N_R$ and the area 36 sandwiched by the curve 32 and the line representing R=(1+A) under $N_R \leq N$ are the area (exposure finish area) wherein the accumulated exposure amount is within the control accuracy A with respect to the proper exposure amount. That is, when the achievement accuracy R is Rc≦R<(1−A) at the time of the finish of the coarse exposure, the correcting exposure mode is selected. Then, the light reducing operation is performed by the light reducing portion 6 for correcting exposure and the oscillations (emissions) of pulse lights are repeated until the achievement accuracy R exceeds Rcc.

At this time, the transmittance a of the light reducing portion 6 for correcting exposure is required to be optimum. First, the maximum value of the exposure energy of a pulse at the time of correcting exposure is (Pave+δP) a and the accumulated exposure amount needs to be within the target control accuracy even through a final pulse is emitted further from the correcting exposure finish judgment level Rcc. Accordingly, the following expression holds:

$$1 - \frac{a}{2N} + \frac{(1 + \delta P/\text{Pave}) \cdot a \cdot \text{Pave}}{N \cdot \text{Pave}} \leq 1 + A \tag{10}$$

From the expression (10), the condition of the transmittance a becomes:

$$a \leq \frac{2 \cdot N \cdot A}{1 + 2\delta P/\text{Pave}} \tag{11}$$

Now, the average number N of coarse exposure pulses, Nmin should be considered. If Nmin=20, A=0.01 and δP/Pave=0.10, the transmittance a becomes:

a≦0.33.

The lesser the transmittance a becomes, the better the control accuracy of the accumulated exposure amount with respect to the proper exposure amount becomes. However, in that case, the number n of correcting exposure pulses are increased, thereby deteriorating the throughput. Therefore, the lower limit of the transmittance a is determined by determining the maximum number $n_{max}$ properly. As the number n of correcting exposure pulses becomes maximum when the average number N of coarse exposure pulses is Nmin., the following expression holds with respect to the transmittance a and the maximum number $n_{max}$ of correcting exposure pulses.

$$1 + A - \frac{(1 + \delta P/\text{Pave})}{N\text{min}} + \frac{a}{N\text{min}} \left( n_{max} - \sqrt{n_{max}} \frac{\delta P}{\text{Pave}} \right) \geq 1 - \frac{a}{2N\text{min}} \tag{12}$$

When e.g., A=0.01, δP/Pave=0.01, Nmin=20 and $n_{max}$ (the maximum number of correcting exposure pulses)=5 are substituted for the experssion (12), the lower limit of the transmittance a becomes:

a≧0.18.

Consequently, in order to limit the number n of correcting exposure pulses within 5 as well as to set the target control accuracy A to be 0.01, the range of the transmittance a is determined as:

0.18≦a≦0.33 (13)

In this case, e.g., the transmittance a is set preferably to be a=0.25. That is, the light reducing portion 6 for correcting exposure of FIG. 1 is structured by the light reducing filter with the transmittance a determined from the expressions (11) and (12). The kind of the transmittance a is desirably set to be one in consideration of the time necessary for switching but may be two or three.

Next, an example of a sequence for performing an exposure process on the wafer W by the above exposure method will be described with reference to the flowcharts of FIGS. 6A, 6B and 7.

First, in the step 101, the operator sets the value corresponding to the proper exposure amount $S_0$ (unit: mJ/cm$^2$) to the main control system 14 via the input/output device 16 of FIG. 1. Note that the information of the proper exposure amount $S_0$ may be provided on the wafer or a cassette as a bar code, which may be read automatically by a bar code reader to set the proper exposure amount $S_0$ to the main control system 14. The proper exposure amount $S_0$ should be determined by a trial print, as disclosed in, e.g., U.S. Pat. No. 4,908,656. Also, for determining the proper exposure amount $S_0$, e.g., a trial print is preliminalily performed and an accumulated value of the light amount monitor 22 when a desired accumulated exposure amount is imparted to the photoresist on the wafer may be made as a reference. If the accumulated exposure amount with respect to the photoresist is S and the accumulated value by the light amount monitor 22 is I, the proportionality constant k between the accumulated exposure amount S and the accumulated value I is made as a predetermined value. Also, the transmittances of the light reducing portion 5 for coarse exposure and the light reducing portion 6 for correcting exposure of FIG. 1 is preset to be 100%.

Next, in the step 102, Pave (unit: mJ/cm$^2$·pulse; average pulse energy) per a pulse on the exposure surface (the surface of the photoresist rayer) of the wafer W is measured by use with the light receiving device 11, the amplifier 21 and the light amount monitor 22. At this time, the energies of a plurality of pulse lights (e.g., 100 pulses) are averaged to remove the influence of the scatter of the energy per a pulse. If the number of pulse lights for measuring the pulse energies is Nma, the average value of pulse energies: Pave is calculated by referring to the output I of the light amount monitor 22 and utilizing the proportionality constant k as follows:

$$\text{Pave} = \frac{1}{k \cdot Nma} \tag{14}$$

Then, in the step 103, the main control system 14 calculates the average number N of coarse exposure pulses from the average pulse energy per a pulse: Pave and the proper exposure amount $S_0$ as follows:

$N=S_0/\text{Pave}$ (15)

In the step 104, when the average number N of coarse exposure pulses is equal to or more than the predetermined integer $N_R$ (expressions (7)), the correcting exposure is not carried out. That is, only the coarse exposure is carried out and the operation goes to the step 131 in FIG. 7 to perform exposures by the cutoff control (accumulated exposure). In this case, $N \geq N_R$ holds, so that exposure finish judgment level Rc is determined by the following expressions: (step 134)
When $$N_R \leq N \leq 2 \cdot \text{int}\left(\frac{1 + \delta P/P\text{ave}}{2A}\right),$$

$$Rc = 1 + A - \frac{1 + \delta P/P\text{ave}}{\text{int}(N)}.$$

When $$N > 2 \cdot \text{int}\left(\frac{1 + \delta P/P\text{ave}}{2A}\right) \quad (16)$$

$$Rc = 1$$

Then, the light reduction is not carried out by the light reducing portion 5 for coarse exposure and the light reducing portion 6 for correcting exposure. In the step 135, the main control system imparts a light emission trigger to the pulse laser light source 3 via the trigger controller 17 to emit a pulse light to the wafer W. Thereafter, in the step 136, the main control system 14 calculates the achievement accuracy R of the accumulated exposure amount obtained by the pulse oscillation until then from the accumulated output I of the light amount monitor 22 and the proper exposure amount $S_0$ ($R=I/(kS_0)$). And, the steps 135 and 136 are repeated until the achievement accuracy R satisfies the following expression:

$$R \geq Rc \quad (17)$$

Further, in the step 138, when the achievement accuracy R is less than the upper limit (1+A) with respect to the proper exposure amount $S_0$, the operation goes to the step 139 and whether there is a shot area to be exposed next on the wafer W is checked. And, when there is a shot area to be exposed, the procedure goes to the step 135 thereby to repeat the exposure by the cutoff control (i.e., the coarse exposure) in the first stage. Then, in the step 139, it is judged that there is no shot area to be exposed, the exposure process to the wafer W is completed. On the other hand, in the step 138, when the achievement accuracy R is larger than the upper limit (1+A) of the target control accuracy, in the step 140, an error display is carried out to notify that the accumulated exposure amount to the shot area exceeded the range of the target control accuracy and the procedure goes to the step 139. The error display means that a message of the exposure error is displayed on the CRT (or cathode-ray tube) constituting the input/output device 16. Also, a shot map of the wafer as well as the message may be displayed to distinguish a shot area with wrong exposure from the other shot areas in the shot map. In step of the error display, e.g., errors may be notified to the operator by a buzzer.

Figures 6, 6A:
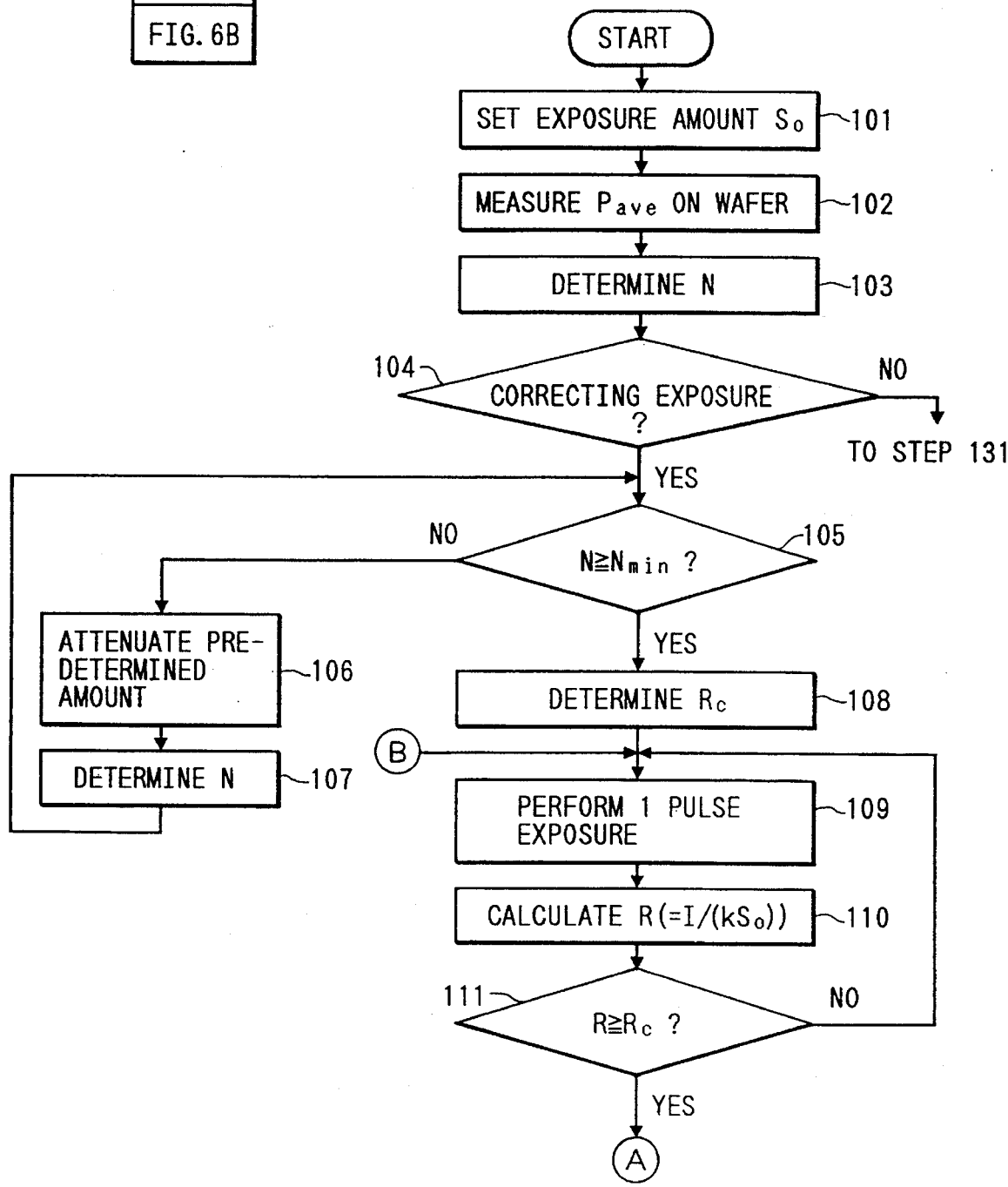
FIG. 6 is comprised of FIGS. 6A and 6B, showing flowcharts of a sequence of the exposure method of the embodiment.
Figure 6B:
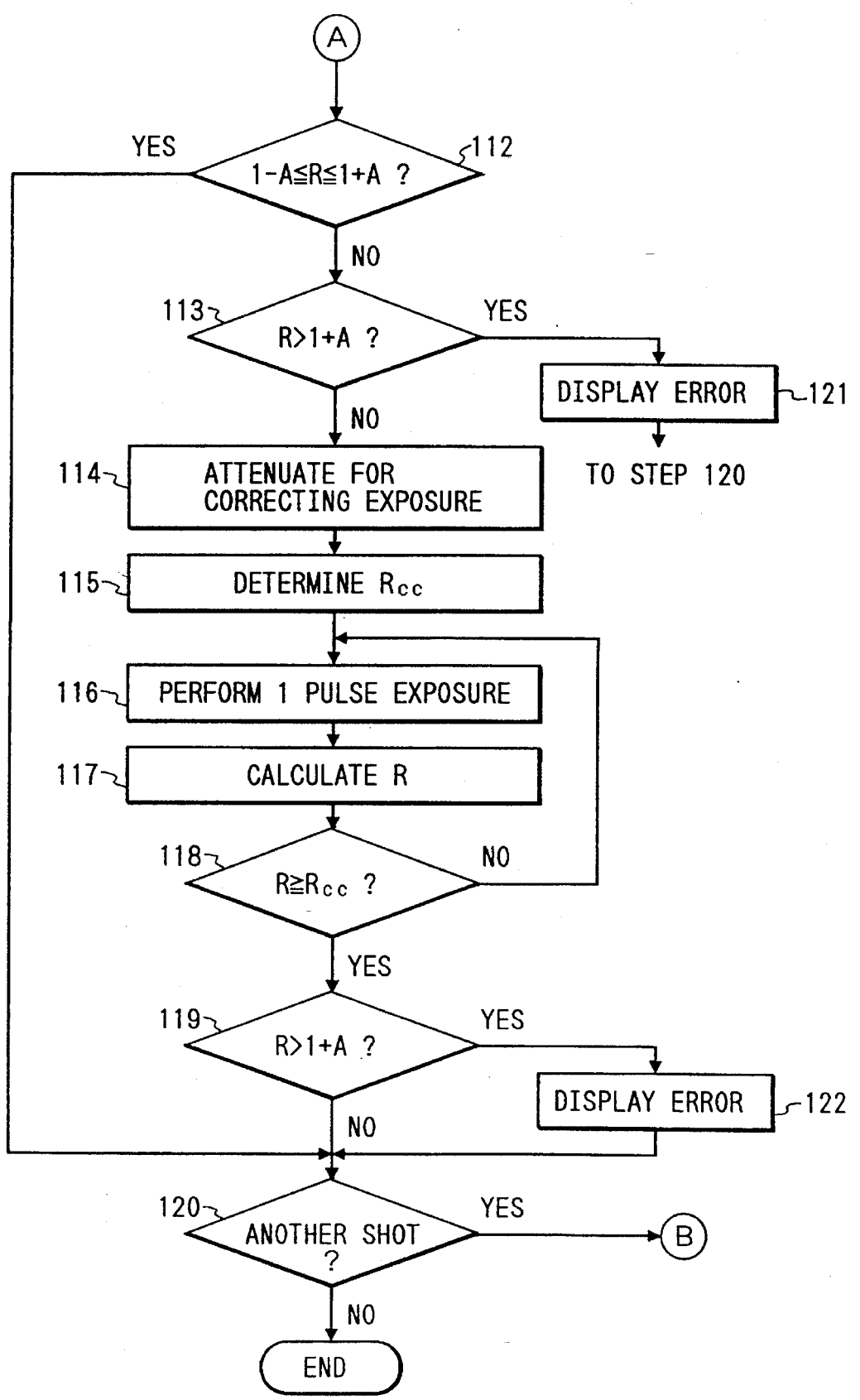

On the other hand, in the step 104 of FIG. 6A, when the average number N of coarse exposure pulses is $N < N_R$, the procedure goes to the step 105 and the exposure process is performed under the correcting exposure method. In the step 105, when the average number N of coarse exposure pulses is lesser than the minimum number Nmin of exposure pulses (equation (3)) input preliminarily as the control data in the memory 15 of FIG. 1, the light reduction is performed even for the coarse exposure in the step 106. That is, the main control system 14 sends instructions to the second light amount controller 19 to drive the light reducing filter plate 1 thereby to position the light reducing filter capable of satisfying N≧Nmin in the light reducing portion 5 for coarse exposure in the optical light path. At this time, if there are a plurality of the light reducing filters capable of satisfying N≧Nmin, the light reducing filter with the largest transmittance is selected and disposed in the optical light path. Here, e.g., the filter 2B is selected and disposed in the optical light path instead of the filter 2A. Simultaneously, in the step 107, the main control system 14 calculates the average number N of coarse exposure pulses at the time of using the light reducing filter 2B selected previously. Then, when the procedure goes again back to the step 105, N≧Nmin holds.

When thus N≧Nmin holds, in the step 108, the main control system 14 sets the coarse exposure finish judgment level Rc based on the equation (5). Thereafter, in the step 109, the main control system 14 outputs instructions to the trigger controller 17 to start exposure. The trigger controller 17 then supplies a light emission trigger to the pulse laser light source 3, thereby starting the coarse exposure. The main control system 14 calculates the achievement accuracy R ($=I/(kS_0)$) from the accumulated output I of the light amount monitor 22 (step 110) to check whether the achievement accuracy R reached the coarse exposure finish judgment level Rc (step 110). At this time, the main control system 14 continues the coarse exposure (pulse oscillations) until the achievement accuracy R reaches or exceeds the coarse exposure finish judgment level Rc.

Then, after the achievement accuracy R becomes R≧Rc, the main control system 14 finishes the coarse exposure and starts the step 112. In the step 112, it is checked whether the accumulated exposure amount is within the range of the target control accuracy with respect to the proper exposure amount $S_0$, i.e., (1−A)≦R≦(1+A). Then, when the accumulated exposure amount is within the range of the target control accuracy with respect to the proper exposure amount $S_0$, the exposure operation is finished without conducting the correcting exposure in the step 120. At this time, when there is an unexposed shot area on the wafer W, the procedure goes immediately to the step 109 to effect the exposure process for the unexposed shot area. On the other hand, when there is no unexposed shot area, the exposure for the wafer W ends.

In the step 112, when the achievement accuracy R is Rc≦R<(1−A) or R>(1+A), the procedure goes to the step 113. When the achievement accuracy R is R>(1+A), in the step 113, the error display is carried out to indicate that the accumulated exposure amount of the shot area exceeded the target control accuracy with respect to the proper exposure amount and the procedure goes to the step 120. Also, when the achievement accuracy R is Rc≦R<(1−A), the correcting exposure is performed. That is, the main control system 14 sends instructions to the third light amount controller 20 to drive the light reducing portion 6 for correcting exposure. The third light amount controller 20 drives at least one of the light reducing filters 23 and 24, to dispose in the optical light path the light reducing filter having the transmittance a determined based on the expressions (11) and (12). After the preparation for the correcting exposure has been completed, in the step 115, the main control system 14 determines the correcting exposure finish judgment level Rcc from the following equation:

$$Rcc = 1 - \frac{a}{2N^*} \quad (18)$$

In the equation (18), a is the transmittance predetermined based on the expressions (11), (12) and $N^*$ is the actual number of pulses oscillated during the coarse exposure.

Next, in the step 116, the main control system 14 sends instructions to the trigger controller 17 to start exposure again. Then, the trigger controller 17 supplies a light emission trigger to the pulse laser light source 3, thereby starting the correcting exposure. The main control system 14 calculates the achievement accuracy R $(=I/(kS_0))$ from the output I of the light amount monitor 22 (step 117) to check whether the achievement accuracy R reached the correcting exposure finish judgment level Rcc (step 118). At this time, the main control system 14 continues the correcting exposure (pulse oscillation) until the achievement accuracy R is equal to or more than the correcting exposure finish judgment level Rcc. That is, the correcting exposure is continued until the achievement accuracy R is R>Rcc and the number n of correcting exposure pulses becomes within the desired maximum value $n_{max}$ when the correcting exposure is finished.

The main control system 14 finishes the correcting exposure when the achievement accuracy R becomes R≧Rcc and starts the step 119. In the step 119, when the achievement accuracy R is R>(1+A), the procedure goes to the step 120. On the other hand, when the achievement accuracy R is R>(1+A), in the step 122, the error display is carried out to inform that the accumulated exposure amount for the shot area exceeds the target control accuracy with respect to the proper exposure amount $S_0$ and the procedure goes to the step 120.

In the step 120, it is judged whether the exposure process is continued for the next shot area on the wafer W or not. When it is continued, the stepping of the wafer stage 13 of FIG. 1 is conducted. Then, after the transmittance of the light reducing portion 6 for correcting exposure is returned to the initial rate (100% transmittance), the procedure goes to the step 109. On the other hand, when the entire shot areas on the wafer W have been exposed, the exposure sequence for the wafer W finishes. The description of the operation of the oscillating mirror 7 for removing the unevenness of the luminous intensity by the interference pattern is omitted in the above sequence, but which is disclosed in U.S. Pat. No. 4,970,546.

In the above embodiment, the target control accuracy is achieved by performing the correcting exposure. However, due to the characteristics of the sensitivity of photoresists, when the average number N of coarse exposure pulses is closed to the integer $N_R$ even though the average number N of coarse exposure pulses is equal to or less than the integer $N_R$, there is a case that the time necessary for exposing a shot area by switching of the transmittances (the light reducing filters 23 and 24) for the correcting exposure becomes longer than that necessary for exposing the same shot area by the above-mentioned one stage cutoff control. That is, when the correcting exposure is performed, the throughput is lowered.

Figure 7:
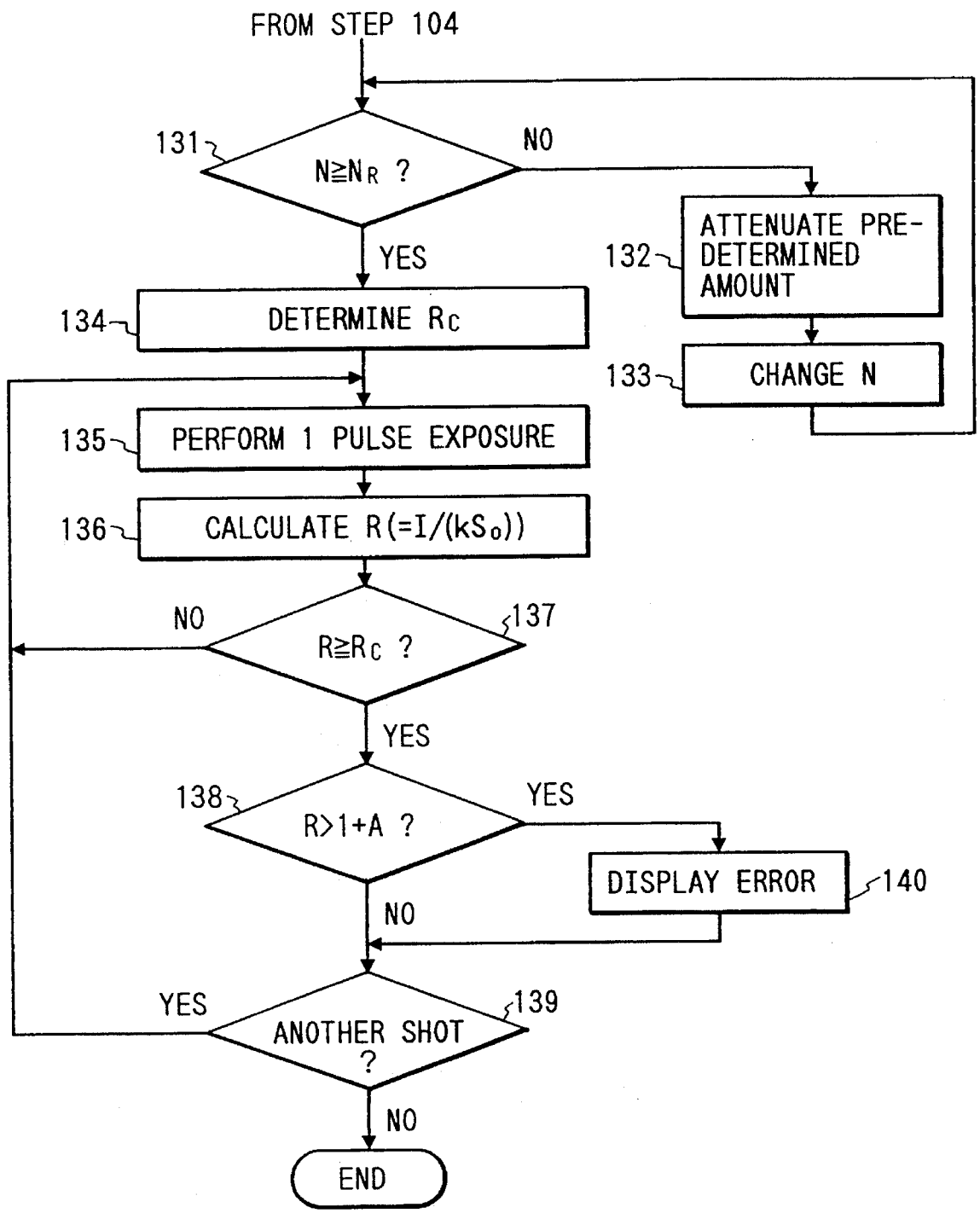
FIG. 7 is a flowchart showing a sequence of the exposure method of the embodiment.

Then, when the throughput is lowered rather by performing the correcting exposure, the procedure may go from the step 104 of FIG. 6A to the step 131 of FIG. 7 and the accumulating exposure mode as disclosed in U.S. Pat. Nos. 4,970,546 and 5,097,291 may be effected. In the above embodiment, to adopt the correcting exposure mode is the precondition and the transmittances of the light reducing portions 5 and 6 are very high for the coarse exposure. Therefore, in the step 131, N<$N_R$ holds and it is impossible to obtain the desired target control accuracy by the one stage cutoff control (accumulating exposure mode) as shown in FIG. 4. Accordingly, when N<$N_R$ holds, in the step 132, the main control system 14 changes the transmittance of the light reducing portion 5 for coarse exposure by second light amount controller 19 so as to be N≧$N_R$. Further, the main control system 14 calculates newly the average number N of coarse exposure pulses in accordance with the changed transmittance and goes to the step 131. As N≧$N_R$ holds by the above operation, the exposure process is started in the step 134. Next, the steps 136 to 140 are effected similarly to the above embodiment (FIGS. 6A and 6B) to expose the projected image of the pattern of the reticle RT on each shot area on the wafer.

Here, under what condition the correcting exposure mode of the above embodiment is utilized is determined by the balance between photoresists to be used and throughputs. Accordingly, in consideration of the above, it is effective to improve the sequence so as to be able to reduce the throughput.

Now, an example of such an improved sequence will be described. It is assumed that the oscillating frequency of the pulse laser light source 3 of FIG. 1 is f (pps), the time necessary for attenuating the light in the correcting exposure is $t_1$ (sec.), the time necessary for attenuating the light in the coarse exposure is $t_0$ (sec.) and the maximum number of correcting exposure pulses is $n_{max}$. The maximum value $n_{max}$ is the function of the average number N of coarse exposure pulses obtained in the step 103 and is a known value. The entire shot areas (the number u of shot areas) on the wafer each are exposed with the same exposure amount and the average number N of coarse exposure pulses is calculated in the step 103. At this time, when the average number N of the coarse exposure pulses is $N_{min}$≦N<$N_R$, the judgment whether the correcting exposure mode is adopted or the accumulating exposure mode is adopted by reducing the pulse energies so as to be N≧$N_R$ is made by the following expression:

$$t_0 + N_R'(1/f)\, u \geq \{(1/f)(n_{max}/2 + N) + t_1\}u \quad (19)$$

The left side of the expression expresses the time necessary for performing exposures for the entire shot areas on the wafer in the accumulating exposure mode. Also, when attenuating the pulse laser lights by using one of a plurality of light reducing filters of the light reducing portion 5 for coarse exposure, it is set that the average number N of coarse exposure pulses is N≧$N_R$ and $N_R'$ is the closest value to $N_R$. The reason is that the lesser the average number N of coarse exposure pulses becomes, the better the throughput becomes. Therefore, when the accumulating exposure mode is adopted in the apparatus of FIG. 1, the time for the exposure process is shortest when the light reducing filter which can make the average number N of coarse exposure pulses be $N_R'$ is selected. Accordingly, when there are a plurality of light reducing filters capable of making the average number N of coarse exposure pulses be N≧$N_R$, the light reducing filter by which the value of the average number N of coarse exposure pulses becomes the closest to $N_R$ is selected and disposed in the optical light path.

The right side of the expression (19) expresses the time necessary for the exposure process of the entire shot areas on the wafer in the correcting exposure mode as described in the above embodiment. Especially in the right side of the expression (19), when the correcting exposure mode is adopted, the correcting exposures are effected on the entire shot areas, so the step 114 is selected after the steps 112 and 113. Then, in the right side of the expression (19), when the correcting exposure mode is adopted in the apparatus of FIG. 1, the worst case in which the time for the exposure process i.e., the throughput becomes longest is considered. The cutoff control is effected also in the correcting exposure mode, wherein the number n of correcting exposure pulses is not known initially. However, the number n of correcting exposure pulses satisfies 1≦n≦max. Therefore, in the right side of the expression (19), $n_{max}/2$ as an expected value is used for the number n of correcting exposure pulses.

Consequently, in the step 104 of FIG. 6A, when the equation (19) holds, the correcting exposure mode is selected. On the other hand, when the equation (19) does not hold, the accumulating exposure mode is selected. Thus, it is possible to shorten the time for the whole exposure by forming the sequence capable of selecting the preferable mode for the throughput. Although either the correcting exposure mode or the accumulating exposure mode is selected based on the expression (19) in the above description, when photoresists with high sensitivity are utilized, always the correcting exposure mode may be selected. When applying the correcting exposure mode to photoresists with high sensitivity, it is possible to reduce the number of pulse lights per a shot area considerably. As a result, the lifetime of the pulse laser light source 3 can be lengthened, contributing to the reduction of the running cost. When using photoresists other than those with high sensitivity, the exposure mode should be selected based on the expression (19).

What is claimed is:

1. A method of transferring a pattern formed on a mask to a photosensitive substrate by illuminating said mask with a plurality of pulse lights whose respective amounts are varied for respective oscillations, said method comprising:

the first step of regulating the amount of a pulse light for illuminating said mask such that the reference number of pulses obtained by dividing a proper exposure amount for said photosensitive substrate by the average amount of said plurality of pulse lights becomes equal to or more than a predetermined allowable value;

the second step of determining a first exposure amount to be imparted to said photosensitive substrate by use with said regulated pulse light on the basis of the reference number of said pulses and a variation range of the amounts of said plurality of pulse lights;

the third step of illuminating said mask by imparting said regulated pulse light repeatedly to said mask until an accumulated light amount of said photosensitive substrate becomes equal to or more than said first exposure amount;

the fourth step of attenuating said regulated pulse light being directed toward said mask;

the fifth step of determining a second exposure amount to be imparted to said photosensitive substrate by use with said attenuated pulse light on the basis of the number of said regulated pulse lights which illuminated said mask in said third step; and the sixth step of illuminating said mask by imparting said attenuated pulse light repeatedly to said mask until the accumulated light amount of said photosensitive substrate becomes equal to or more than said second exposure amount.

2. A method according to claim 1, wherein said second exposure amount $E_2$ is set to be $$E_2 = N \cdot Pave - (a/2) \cdot Pave,$$

wherein

Pave: the average amount of said regulated pulse lights

N: the reference number of said pulses a: the attenuating rate of said regulated pulse lights.

3. A method of transferring a pattern formed on a mask to a photosensitive substrate by illuminating said mask with a plurality of pulse lights whose respective amounts are varied for respective oscillations, said method comprising:

the first step of regulating the amount of a pulse light for illuminating said mask such that the reference number of pulses obtained by dividing a proper exposure amount for said photosensitive substrate by the average amount of said plurality of pulse lights becomes equal to or more than a predetermined allowable value;

the second step of determining a target exposure amount to be imparted to said photosensitive substrate by use with said regulated pulse light on the basis of said reference number of said pulses and a variation range of the amounts of said plurality of pulse lights;

the third step of illuminating said mask by imparting said regulated pulse light repeatedly to said mask until an accumulated light amount of said photosensitive substrate becomes equal to or more than said target exposure amount; and the fourth step of attenuating said regulated pulse light and directing at least one said attenuated pulse light to said mask when the accumulated light amount imparted to said photosensitive substrate in the third step is less than a lower limit of said proper exposure amount.

4. A method of controlling an accumulated light amount to a photosensitive substrate to a predetermined proper value when transferring a pattern formed on a mask to said photosensitive substrate by illuminating said mask with a plurality of pulse lights whose respective amounts are varied for respective oscillations, said method comprising:

the step of selecting either a first exposure mode for attenuating the amounts of a few of said plurality of pulse lights in the course of illuminating said mask by imparting said plurality of pulse lights to said mask or a second exposure mode for illuminating said mask with said plurality of pulse lights having approximately the same light amount on the basis of sensitivity characteristics of said photosensitive substrate; and the step of regulating, prior to illuminating said mask with said plurality of pulse lights in accordance with said selected exposure mode, the amounts of said plurality of pulse lights such that the number of pulses obtained by dividing a proper exposure amount of said photosensitive substrate by the average amount of said plurality of said pulse lights becomes equal to or more than a reference value.

5. A method of transferring a pattern formed on a mask to a photosensitive substrate by illuminating said mask with a plurality of pulse lights whose respective amounts are varied for respective oscillations, said method comprising:

a first step of regulating the amount of a pulse light such that the number of pulses obtained by dividing a proper exposure amount for said photosensitive substrate by the amount of said pulse light becomes equal to or more than a predetermined allowable value;

a second step of illuminating said mask with said regulated pulse light until an accumulated light amount of said photosensitive substrate becomes substantially equal to a first target exposure amount;

a third step of attenuating said regulated pulse light; and a fourth step of illuminating said mask with said attenuated pulse light until the accumulated light amount of said photosensitive substrate becomes substantially equal to a second target exposure amount.

6. A method according to claim 5, wherein in said first step a transmittance of an optical element through which said pulse lights pass is changed to regulate the amount of said pulse light.

7. A method according to claim 5, wherein when said accumulated light amount in said photosensitive substrate in said second step exceeds a lower limit of the proper exposure amount, executions of said third and fourth steps are prohibited.

8. A method of illuminating a mask with a plurality of pulse lights whose respective amounts are varied for respective oscillations, in order to expose a photosensitive substrate with an image of a pattern on the mask, comprising:

illuminating said mask with the number of pulses more than an allowable value which corresponds to a variation range of the amount of said pulse light until an accumulated amount of light of said photosensitive substrate becomes substantially equal to a second target exposure amount; and attenuating said pulse light and illuminating said mask with the attenuated pulse light until the accumulated amount of light of said photosensitive substrate becomes substantially equal to a second target exposure amount.

9. A method according to claim 8, wherein the amount of said pulse light is regulated so that the number of said pulse light exceeds said allowable value, thereby said mask being illuminated with the regulated amount of said pulse light.

10. A method of transferring a pattern on a mask to a photosensitive substrate by illuminating said mask with a plurality of pulse lights whose respective amounts are varied for respective oscillations, said method comprising:

selecting, in accordance with the number of pulses obtained by dividing a proper exposure amount for said photosensitive substrate by the amount of said pulse light, either of a first exposure mode in which the amount of said pulse light is attenuated while said mask is being illuminated by said plurality of pulse lights and a second exposure mode in which the respective amounts of said plurality of pulse lights are made substantially equal to each other and said mask is illuminated thereby; and illuminating said mask in accordance with the selected exposure mode.

11. A method according to claim 10, wherein in said first exposure mode the amount of the pulse lights is regulated so that the number of the pulse lights may exceed a predetermined allowable value, thereby before the amount of said pulse lights is attenuated said mask being illuminated with the regulated amount of the pulse lights.

* * * * *